United States Patent
Cho

(10) Patent No.: US 11,864,374 B2
(45) Date of Patent: Jan. 2, 2024

(54) SEMICONDUCTOR MEMORY DEVICE

(71) Applicant: SK hynix Inc., Gyeonggi-do (KR)

(72) Inventor: Jin Sun Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 132 days.

(21) Appl. No.: 17/491,971

(22) Filed: Oct. 1, 2021

(65) Prior Publication Data

US 2022/0285353 A1    Sep. 8, 2022

(30) Foreign Application Priority Data

Mar. 5, 2021    (KR) .......................... 10-2021-0029443

(51) Int. Cl.
*H10B 12/00*    (2023.01)
*H01L 29/786*    (2006.01)

(52) U.S. Cl.
CPC ............. *H10B 12/30* (2023.02); *H10B 12/03* (2023.02); *H10B 12/05* (2023.02); *H10B 12/482* (2023.02); *H10B 12/488* (2023.02); *H10B 12/50* (2023.02); *H01L 29/7869* (2013.01); *H01L 29/78672* (2013.01); *H01L 29/78684* (2013.01)

(58) Field of Classification Search
CPC ............. H01L 27/108; H01L 27/10805; H01L 27/1085; H01L 27/10873; H01L 27/10885; H01L 27/10891; H01L 27/10897; H01L 29/78672
See application file for complete search history.

(56) References Cited

U.S. PATENT DOCUMENTS

| | | | |
|---|---|---|---|
| 10,535,659 B2 | 1/2020 | Kim et al. | |
| 10,804,273 B2 | 10/2020 | Ramaswamy | |
| 2005/0230729 A1* | 10/2005 | Won ..................... | H10B 12/033 257/296 |
| 2006/0286802 A1* | 12/2006 | Yu ......................... | H01L 29/665 257/E21.334 |
| 2014/0103335 A1* | 4/2014 | Yamazaki ......... | H01L 29/78648 257/43 |
| 2014/0103491 A1* | 4/2014 | Kim ...................... | H01L 28/60 257/532 |
| 2018/0212166 A1* | 7/2018 | May ...................... | H10K 85/40 |
| 2021/0074825 A1* | 3/2021 | Sharma ................ | H01L 29/872 |
| 2021/0265355 A1* | 8/2021 | Sharma ................ | H10N 70/826 |
| 2022/0122977 A1* | 4/2022 | Kim ..................... | H10B 12/30 |
| 2022/0238700 A1* | 7/2022 | Huang .............. | H01L 21/82345 |
| 2022/0285353 A1* | 9/2022 | Cho ..................... | H10B 12/03 |

* cited by examiner

*Primary Examiner* — Edward Chin
(74) *Attorney, Agent, or Firm* — IP & T GROUP LLP

(57) ABSTRACT

A semiconductor memory device includes: an active layer spaced apart from a substrate wherein the active layer extends in a direction parallel to the substrate, and includes a channel; a bit line extending in a direction perpendicular to the substrate and coupled to a first end of the active layer; a capacitor coupled to a second end of the active layer; and a double word line including a pair of dual work function electrodes that extend in a direction crossing the active layer with the active layer interposed therebetween, wherein each of the dual work function electrodes includes: a high work function electrode which is adjacent to the bit line; and a low work function electrode which is adjacent to the capacitor and having a lower work function than the high work function electrode.

27 Claims, 16 Drawing Sheets

SEMICONDUCTOR MEMORY DEVICE

CROSS-REFERENCE TO RELATED APPLICATIONS

The present application claims priority of Korean Patent Application No. 10-2021-0029443, filed on Mar. 5, 2021, which is incorporated herein by reference in its entirety.

BACKGROUND

1. Field

Various embodiments of the present invention relate to a semiconductor device and, more particularly, to a three-dimensional semiconductor memory device.

2. Description of the Related Art

Since the degree of integration of a two-dimensional (2D) semiconductor memory device is mainly determined based on the area occupied by a memory cell, it is greatly affected by the level of fine pattern formation technology. However, since ultra-expensive equipment is required for miniaturization of patterns, the degree of integration of 2D semiconductor memory devices is increasing, but it is still limited. Therefore, three-dimensional semiconductor memory devices including memory cells that are arranged in three dimensions are suggested.

SUMMARY

Embodiments of the present invention are directed to a three-dimensional semiconductor memory device including highly integrated memory cells.

In accordance with an embodiment of the present invention, a semiconductor memory device includes: an active layer spaced apart from a substrate wherein the active layer extends in a direction parallel to the substrate and includes a channel; a bit line extending in a direction perpendicular to the substrate and coupled to a first end of the active layer; a capacitor coupled to an end of a second end of the active layer; and a double word line including a pair of dual work function electrodes extending in a direction crossing the active layer with the active layer interposed therebetween, wherein each of the dual work function electrodes includes a high work function electrode which is adjacent to the bit line; and a low work function electrode which is adjacent to the capacitor and having a lower work function than the high work function electrode.

In accordance with another embodiment of the present invention, a semiconductor memory device includes: a substrate; active layers stacked in a direction perpendicular to a surface of the substrate and including channels; a bit line coupled to first ends of the active layers and oriented in a direction perpendicular to the surface of the substrate; capacitors coupled to second ends of the active layers and including storage nodes that are stacked in the direction perpendicular to the surface of the substrate; and double word lines having a first word line and a second word line that are oriented in a direction parallel to the surface of the substrate with each of the active layers interposed therebetween, wherein each of the first word line and the second word line includes: a high work function electrode which is adjacent to the bit line; and a low work function electrode which is adjacent to the storage nodes and having a lower work function than the high work function electrode.

DETAILED DESCRIPTION

Figure 1:
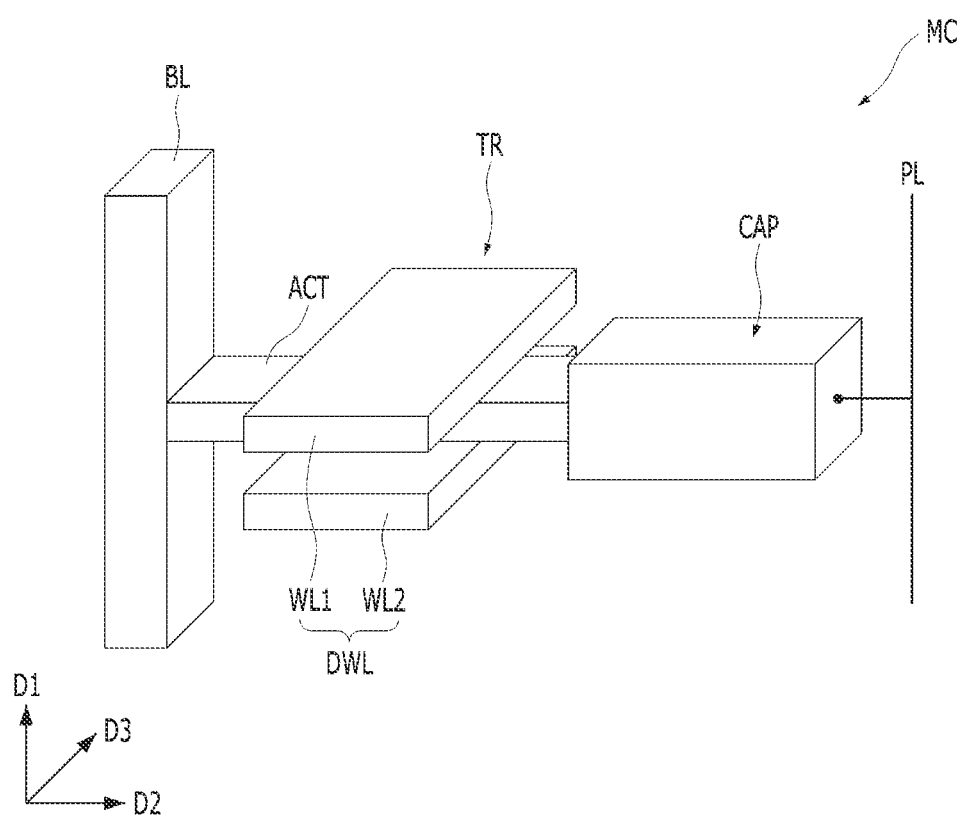
FIG. 1 is a schematic perspective view illustrating a memory cell of a semiconductor memory device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to the following embodiment of the present invention, memory cell density may be increased while reducing parasitic capacitance by vertically stacking memory cells.

The following embodiments of the present invention, which will be described later, are related to three-dimensional (3D) Dynamic Random-Access Memory (DRAM) devices, and a word line may include a low work function electrode and a high work function electrode. The low work function electrode may be adjacent to a capacitor, and the high work function electrode may be adjacent to a bit line.

With the low work function of the low work function electrode, a low electric field may be formed between the word line and the capacitor, thereby improving leakage current.

The high work function of the high work function electrode not only forms a high threshold voltage of a transistor, but also reduces the height of the memory cell due to the formation of the low electric field, which is advantageous in terms of integration degree.

Figure 2:
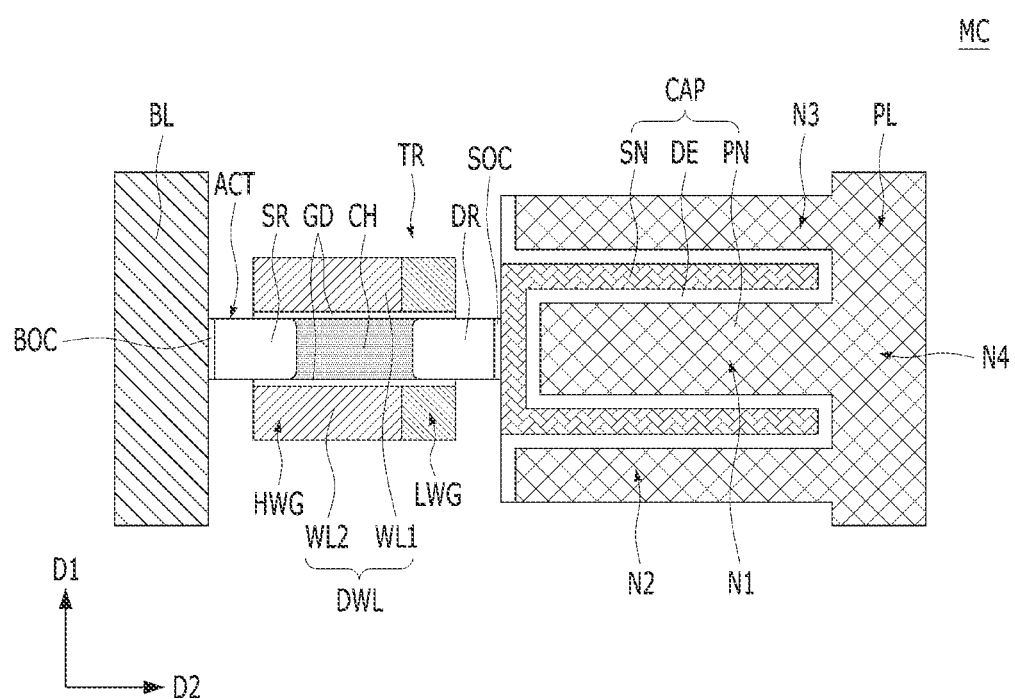
FIG. 2 is a cross-sectional view illustrating the memory cell of FIG. 1.

FIG. 1 is a schematic perspective view illustrating a memory cell of a semiconductor memory device in accordance with an embodiment of the present invention. FIG. 2 is a cross-sectional view illustrating the memory cell of FIG. 1.

Referring to FIGS. 1 and 2, the memory cell MC of a 3D semiconductor memory device in accordance with an embodiment of the present invention may include a bit line BL, a transistor TR, and a capacitor CAP. The transistor TR may include an active layer ACT, a gate dielectric layer GD, and a double word line DWL. The capacitor CAP may include a storage node SN, a dielectric layer DE, and a plate node PN. The bit line BL may have a pillar shape extending in a first direction D1. The active layer ACT may have a bar shape extending in a second direction D2 crossing the first direction D1. The double word line DWL may have a line shape extending in a third direction D3 crossing the first and second directions D1 and D2. The plate node PN of the capacitor CAP may be coupled to the plate line PL.

The bit line BL may be vertically oriented in the first direction D1. The bit line BL may be referred to as a vertically-oriented bit line, a vertically-extended bit line, or a pillar-shaped bit line. The bit line BL may include a conductive material. The bit line BL may include, for example, a silicon-based material, a metal-based material, or a combination thereof. The bit line BL may include polysilicon, a metal, a metal nitride, a metal silicide, or a combination thereof. The bit line BL may include, for example, polysilicon, titanium nitride, tungsten, or a combination thereof. For example, in an embodiment, the bit line BL may include polysilicon or titanium nitride (TiN) that is doped with an N-type impurity. In another embodiment, the bit line BL may include a stack of titanium nitride and tungsten (TiN/W).

The double word line DWL may extend along in the third direction D3, and the active layer ACT may extend in the second direction D2. The active layer ACT may be laterally arranged from the bit line BL. The double word line DWL may include a first word line WL1 and a second word line WL2, The first word line WL1 and the second word line WL2 may face each other with the active layer ACT interposed therebetween. A gate dielectric layer GD may be formed over the upper and lower surfaces of the active layer ACT. The first word line WL1 may be positioned above the active layer ACT, and the second word line WL2 may be positioned below the active layer ACT.

The active layer ACT may include, for example, a semiconductor material or an oxide semiconductor material. For example, the active layer ACT may include silicon, germanium, silicon-germanium, or Indium Gallium Zinc Oxide (IGZO). The active layer ACT may include a channel CH, a first source/drain region SR between the channel CH and the bit line BL, and a second source/drain region DR between the channel CH and the capacitor CAP.

The first source/drain region SR and the second source/drain regions DR may be doped with impurities of the same conductivity type. The first source/drain region SR and the second source/drain regions DR may be doped with an N-type impurity or a P-type impurity. The first source/drain region SR and the second source/drain region DR may include at least one impurity selected among arsenic (As), phosphorus (P), boron (B), indium (In), and combinations thereof. A first side of the first source/drain region SR may be in contact with the bit line BL, and a second side of the first source/drain region SR may be in contact with the channel CH. A first side of the second source/drain region DR may be in contact with the storage node SN, and a second side of the second source/drain region DR may be in contact with the channel CH. The second side of the first source/drain region SR and the second side of the second source/drain region DR may partially overlap with the sides of the first and second word lines WL1 and WL2, respectively. The lateral length of the channel CH in the second direction D2 may be smaller than the lateral lengths of the first and second source/drain regions SR and DR in the second direction D2. According to another embodiment of the present invention, the lateral length of the channel CH in the second direction D2 may be greater than the lateral lengths of the first and second source/drain regions SR and DR in the second direction D2.

The transistor TR may be a cell transistor and may have a double word line DWL. In the double word line DWL, the first word line WL1 and the second word line WL2 may have the same potential. For example, the first word line WL1 and the second word line WL2 may form a pair and may be coupled to one memory cell MC. The same word line driving voltage may be applied to the first word line WL1 and the second word line WL2. As described above, the memory cell MC according to an embodiment of the present invention may have a double word line DWL in which the first and second word lines WL1 and WL2 are adjacent to one channel CH. The active layer ACT and the channel CH may have the same vertical thickness as that of each of the first and second word lines WL1 and WL2.

The upper and lower surfaces of the active layer ACT may have flat surfaces. The upper and lower surfaces of the active layer ACT may be parallel to each other in the second direction D2.

The gate dielectric layer GD may, for example, include silicon oxide, silicon nitride, a metal oxide, a metal oxynitride, a metal silicate, a high-k material, a ferroelectric material, an anti-ferroelectric material or a combination thereof. The gate dielectric layer GD may include, for example, $SiO_2$, $Si_3N_4$, $HfO_2$, $Al_2O_3$, $ZrO_2$, AlON, HfON, HfSiO, HfSiON, or a combination thereof.

The double word line DWL may include, for example, a metal, a metal mixture, a metal alloy, or a semiconductor material. The double word line DWL may include, for example, titanium nitride, tungsten, polysilicon, or a combination thereof. For example, the double word line DWL may include a TiN/W stack in which titanium nitride and tungsten are sequentially stacked. The double word line DWL may include an N-type work function material or a P-type work function material. The N-type work function material may have a low work function of approximately 4.5 eV or less, and the P-type work function material may have a high work function of approximately 4.5 eV or more.

According to an embodiment of the present invention, the double word line DWL may include a pair of word lines, i.e., a first word line WL1 and a second word line WL2, with the active layer ACT interposed therebetween. The double word line DWL may be coupled to one memory cell MC.

Each of the first and second word lines WL1 and WL2 may include a low work function electrode LWG and a high work function electrode HWG. The low work function electrode LWG and the high work function electrode HWG may be laterally positioned in the second direction D2. The low work function electrode LWG and the high work function electrode HWG may be in direct contact. The low work function electrode LWG may be adjacent to the second source/drain region DR, and the high work function electrode HWG may be adjacent to the first source/drain region SR. The low work function electrode LWG and the high work function electrode HWG may be formed of different work function materials. The high work function electrode HWG may have a higher work function than the low work function electrode LWG. The high work function electrode HWG may include a high work function material. The high work function electrode HWG may have a higher work function than a mid-gap work function of silicon. The low work function electrode LWG may include a low work function material. The low work function electrode LWG may be a material having a lower work function than the mid-gap work function of silicon. In other words, the high work function material may have a work function higher than approximately 4.5 eV, and the low work function material may have a work function lower than approximately 4.5 eV. The low work function electrode LWG may include doped polysilicon which is doped with an N-type dopant. The high work function electrode HWG may include a metal-based material. The high work function electrode HWG may include, for example, tungsten, titanium nitride, or a combination thereof. Although not illustrated, a barrier material may be further formed between the low work function electrode LWG and the high work function electrode HWG. The high work function electrode HWG may have a larger volume than the low work function electrode LWG, and accordingly, the double word line DWL may have a low resistance. The high work function electrodes HWG of the first and second word lines WL1 and WL2 may vertically overlap with each other in the first direction D1 with the channel CH interposed therebetween. The low work function electrodes LWG of the first and second word lines WL1 and WL2 may vertically overlap with each other in the first direction D1 with the channel CH interposed therebetween. The overlapping area between the high work function electrode HWG and the channel CH may be larger than the overlapping area between the low work function electrode LWG and the channel CH. The low work function electrode LWG and the high work function electrode HWG may extend in the third direction D3, and the low work function electrode LWG and the high work function electrode HWG may be in direct contact with each other.

As described above, each of the first word line WL1 and the second word line WL2 may have a dual work function electrode structure which includes a low work function electrode LWG and a high work function electrode HWG. In other words, the double word line DWL may have a pair of dual work function electrodes extending in the third direction D3 crossing the channel CH with the channel CH interposed therebetween. The pair of the dual work function electrodes may refer to a pair of the first word line WL1 and the second word line WL2.

A bit line side-ohmic contact BOC may be further formed between the first source/drain region SR and the bit line BL. The bit line side-ohmic contact BOC may have a height that fully covers the sides of the first source/drain region SR. The bit line side-ohmic contact BOC may be formed by depositing a metal layer and performing an annealing process, For example, the bit line side-ohmic contact BOC may be formed as the metal of the metal layer reacts with the silicon of the first source/drain region SR. The bit line side-ohmic contact BOC may include a metal silicide, such as, for example, titanium silicide, cobalt silicide, nickel silicide, or the like.

The capacitor CAP may be laterally disposed in the second direction D2 from the transistor TR. The capacitor CAP may include a storage node SN which laterally extends from the active layer ACT in the second direction D2. The capacitor CAP may further include a dielectric layer DE and a plate node PN over the storage node SN. The storage node SN, the dielectric layer DE, and the plate node PN may be laterally arranged in the second direction D2. The storage node SN may have a horizontally oriented cylinder-shape. The dielectric layer DE may conformally cover the cylinder inner wall and the cylinder outer wall of the storage node SN. The plate node PN may have a shape extending to the cylinder inner wall and the cylinder outer wall of the storage node SN over the dielectric layer DE. The plate node PN may be coupled to the plate line PL. The storage node SN may be electrically connected to the second source/drain region DR.

The storage node SN may have a 3D structure. The storage node SN may have a lateral 3D structure which is oriented in the second direction D2. As an example of the three-dimensional structure, the storage node SN may have a cylinder shape. According to another embodiment of the present invention, the storage node SN may have a pillar shape or a pylinder shape. The pylinder shape may refer to a structure in which a pillar shape and a cylinder shape are merged. The uppermost surface of the storage node SN may be positioned at the same level as the top surface of the first word line WL1. The lowermost surface of the storage node SN may be positioned at the same level as the bottom surface of the second word line WL2.

The plate node PN may include an inner node N1 and outer nodes N2, N3, and N4. The inner node N1 and the outer nodes N2, N3, and N4 may be interconnected to each other. The inner node N1 may be positioned inside the cylinder of the storage node SN. The outer nodes N2 and N3 may be positioned outside the cylinder of the storage node SN with the dielectric layer DE interposed therebetween. The outer node N4 may interconnect the inner node N1 and the outer nodes N2 and N3 to each other. The outer nodes N2 and N3 may be positioned to surround the outer wall of the cylinder of the storage node SN. The outer node N4 may serve as the plate line PL.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN), In the titanium nitride/silicon germanium/tungsten nitride (TiN/SiGe/WN) stack, silicon germanium may be a gap-fill material filling the inside of the cylinder of the storage node SN, and the titanium nitride (TiN) may serve as a plate node PN of a capacitor CAP, and tungsten nitride may be a low-resistance material.

The dielectric layer DE may include, for example, silicon oxide, silicon nitride, a high-k material, or a combination thereof. The high-k material may have a higher dielectric constant than silicon oxide, Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). According to another embodiment of the present invention, the dielectric layer DE may be formed of a composite layer including two or more layers of the high-k materials mentioned above.

The dielectric layer DE may be formed of zirconium-based oxide. The dielectric layer DE may have a stack structure including zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as zirconium oxide-based layer ($ZrO_2$-based layer). According to another embodiment of the present invention, the dielectric layer DE may be formed of hafnium-based oxide. The dielectric layer DE may have a stack structure including hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as hafnium oxide-based layer (HfO2-based layer). In the ZA stack, ZAZ stack, HA stack, and HAH stack, aluminum oxide ($Al_2O_3$) may have a larger band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high band gap material having a larger band gap than the high-k material. The dielectric layer DE may include, for example, silicon oxide ($SiO_2$) as a high band gap material other than aluminum oxide ($Al_2O_3$). Since the dielectric layer DE includes a high band gap material, leakage current may be suppressed. High band gap material may be thinner than high-k material. According to another embodiment of the present invention, the dielectric layer DE may include a laminated structure in which a high-k material and a high band gap material are alternately stacked. For example, ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$). In the laminate structure, which is described above, aluminum oxide ($Al_2O_3$) may be thinner than zirconium oxide ($ZrO_2$) and hafnium oxide ($HfO_2$).

According to another embodiment of the present invention, the dielectric layer DE may include a stack structure, a laminate structure, or a mixed structure including zirconium oxide, hafnium oxide, and aluminum oxide.

According to another embodiment of the present invention, an interface control layer (not shown) for improving leakage current may be further formed between the storage node SN and the dielectric layer DE. The interface control layer may include titanium oxide ($TiO_2$), tantalum oxide ($Ta_2O_5$), or niobium oxide ($Nb_2O_5$). The interface control layer may also be formed between the plate node PN and the dielectric layer DE.

The capacitor CAP may include a Metal-Insulator-Metal (MIM) capacitor. The storage node SN and the plate node PN may include a metal-based material.

The capacitor CAP may be replaced with another data storage material. For example, the data storage material may be a phase change material, a magnetic tunnel junction (MTJ), or a variable resistance material.

A storage node side-ohmic contact SOC may be further formed between the second source/drain region DR and the storage node SN. The storage node side-ohmic contact SOC may have a height that fully covers the side of the second source/drain region DR. The storage node side-ohmic contact SOC may be formed by depositing a metal layer and performing an annealing process. For example, the storage node side-ohmic contact SOC may be formed as the metal of the metal layer reacts with the silicon of the second source/drain region DR. The storage node side-ohmic contact SOC may include a metal silicide. The storage node side-ohmic contact (SOC) may include titanium silicide, cobalt silicide, nickel silicide, or the like.

As described above, the memory cell MC may include a double word line DWL having a pair of dual work function electrode structures. Each of the first word line WL1 and the second word line WL2 of the double word line DWL may include a low work function electrode LWG and a high work function electrode HWG. The low work function electrode LWG may be adjacent to the capacitor CAP, and the high work function electrode HWG may be adjacent to the bit line BL. Due to the low work function of the low work function electrode LWG, a low electric field may be formed between the double word line DWL and the capacitor CAP, thereby improving leakage current. Due to the high work function of the high work function electrode HWG, not only a high threshold voltage of the transistor TR may be formed, but also the height of the memory cell MC may be lowered due to the formation of a low electric field, which may be advantageous for improving the degree of integration.

As Comparative Example 1, when the first word line WL1 and the second word line WL2 are formed of a metal-based material alone, a high electric field may be formed between the first and second word lines WL1 and WL2 and the capacitor CAP, which degrades the leakage current of the memory cell MC. The deterioration of the leakage current that occurs due to the high electric field may be enhanced as the channel CH is thinner.

As Comparative Example 2, when the first and second word lines WL1 and WL2 are formed of a low work function material alone, the threshold voltage of the transistor TR may decrease due to the low work function, thus generating a leakage current.

According to an embodiment of the present invention, each of the first word line WL1 and the second word line WL2 of the double word line DWL has a dual work function electrode structure in order to prevent leakage current. This makes it possible to secure the refresh characteristics of a memory cell MC and reduce power consumption.

Also, according to an embodiment of the present invention, each of the first word line WL1 and the second word line WL2 of the double word line DWL has a dual work function electrode structure, even though the thickness of the channel CH is reduced for the purpose of high integration, which relatively advantageous for increasing the electric field, realizing a high number of stacked layers.

Figure 3:
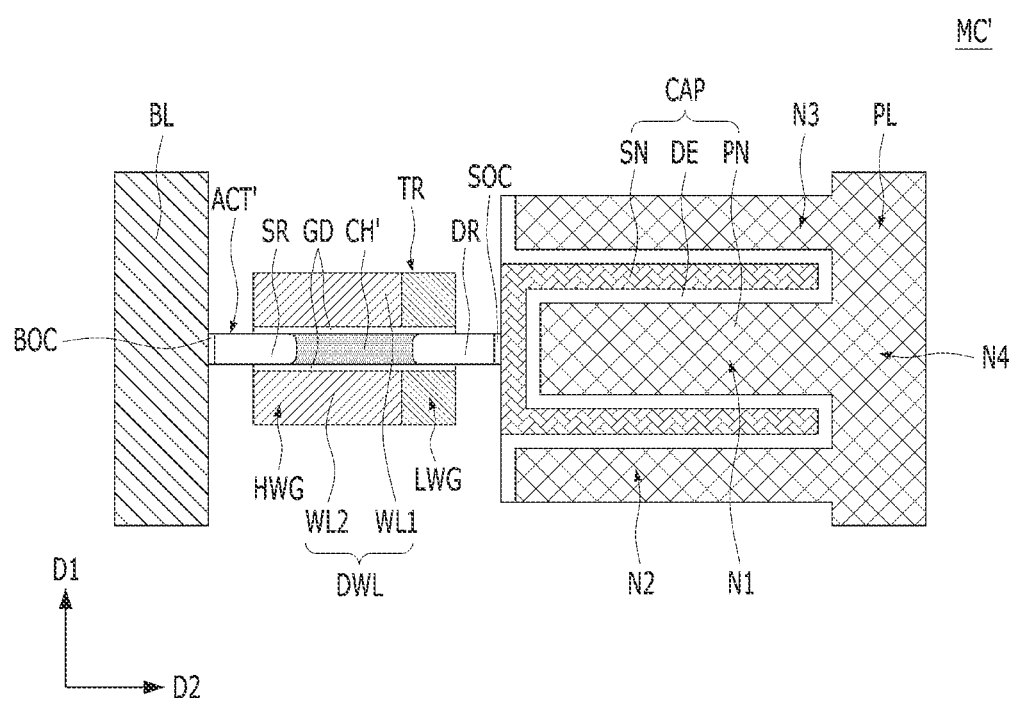
FIG. 3 is a cross-sectional view illustrating a memory cell in accordance with another embodiment of the present invention.

FIG. 3 is a cross-sectional view illustrating a memory cell MC' in accordance with another embodiment of the present invention. In FIG. 3, detailed descriptions on the constituent elements also appearing in FIGS. 1 and 2 may be omitted.

Referring to FIG. 3, the memory cell MC' may include a bit line BL, a transistor TR, and a capacitor CAP. The transistor TR may include a thin-body active layer ACT', and the thin-body active layer ACT' may be thinner than the first word line WL1 and the second word line WL2. In other words, the vertical thickness of the thin-body active layer ACT' in the first direction D1 may be thinner than the vertical thickness of each of the first word line WL1 and the second word line WL2 in the first direction D1. As such, the thin-body active layer ACT' having a thin thickness may include a thin-body channel CH'. The thin-body channel CH' may be thinner than the vertical thickness of each of the first word line WL1 and the second word line WL2. The thickness of the thin-body channel CH' may be approximately 10 nm or less (1 to 10 nm). The first and second word lines WL1 and WL2 may cross the thin-body active layer ACT' with the thin-body active layer ACT' therebetween. A pair of the first word line WL1 and the second word line WL2 may be double word lines DWL each having a dual work function electrode. Each of the first word line WL1 and the second word line WL2 may include a high work function electrode HWG and a low work function electrode LWG.

Figure 4A:
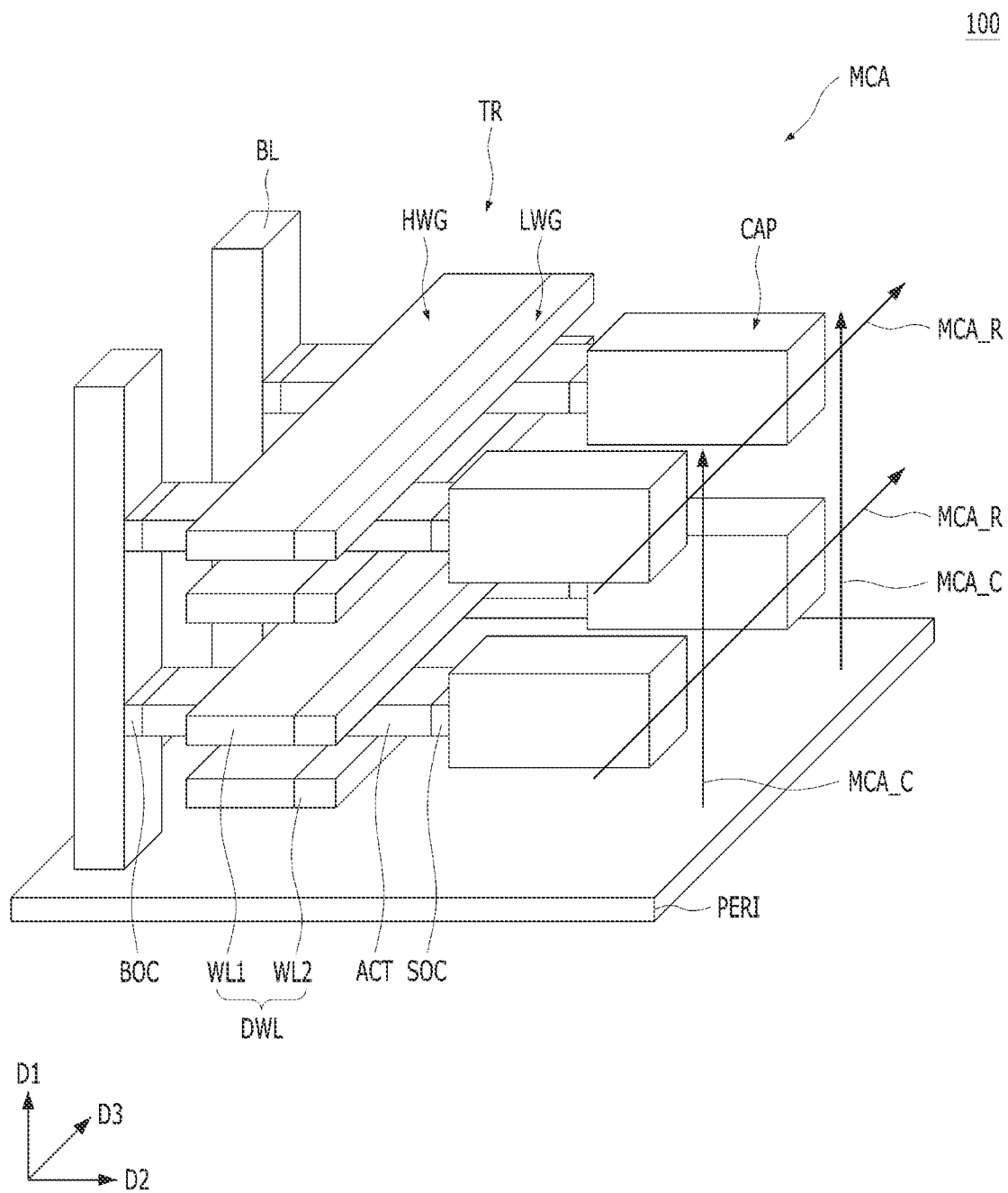
FIG. 4A is a schematic perspective view illustrating a semiconductor memory device in accordance with an embodiment of the present invention.
Figure 4B:
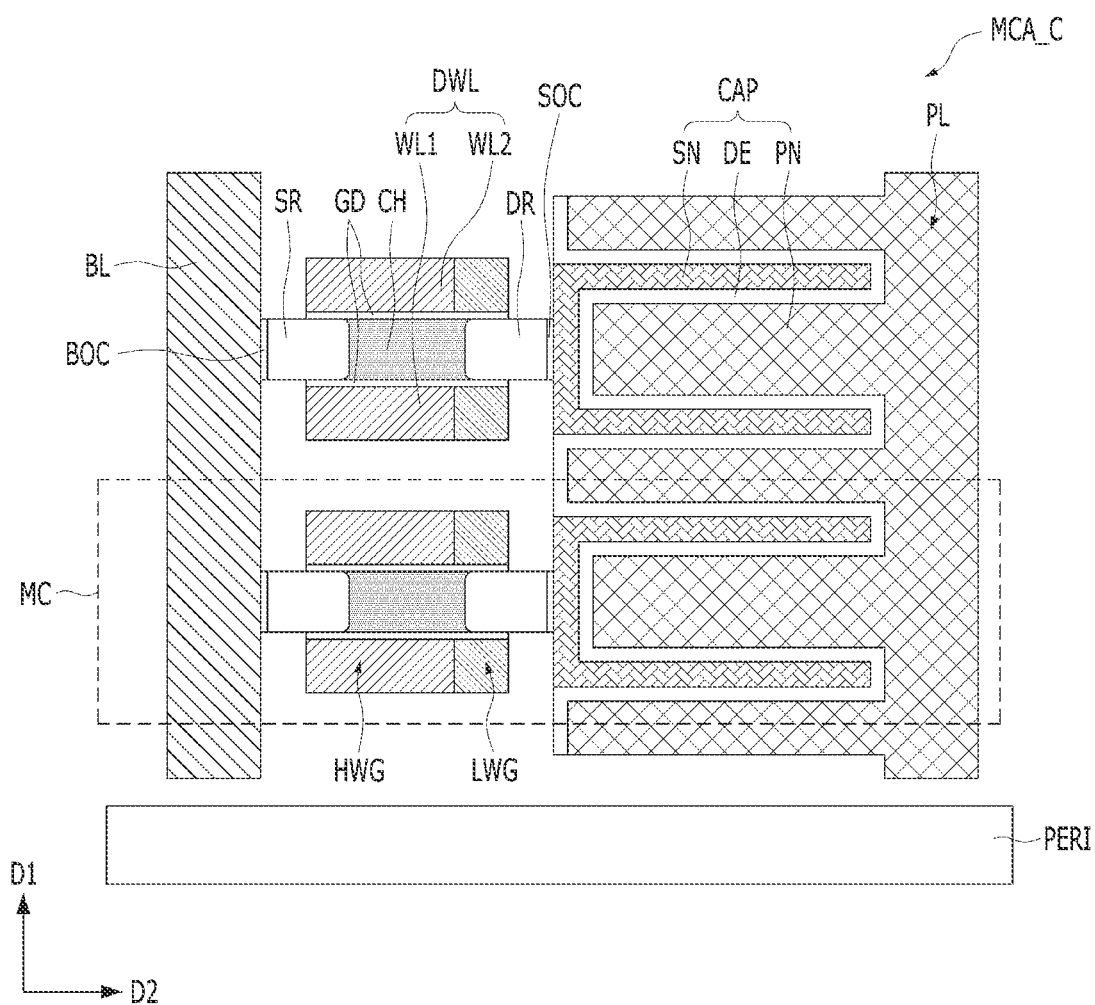
FIG. 4B is a cross-sectional view illustrating a vertical memory cell array MCA_C of FIG. 4A.
Figure 5:
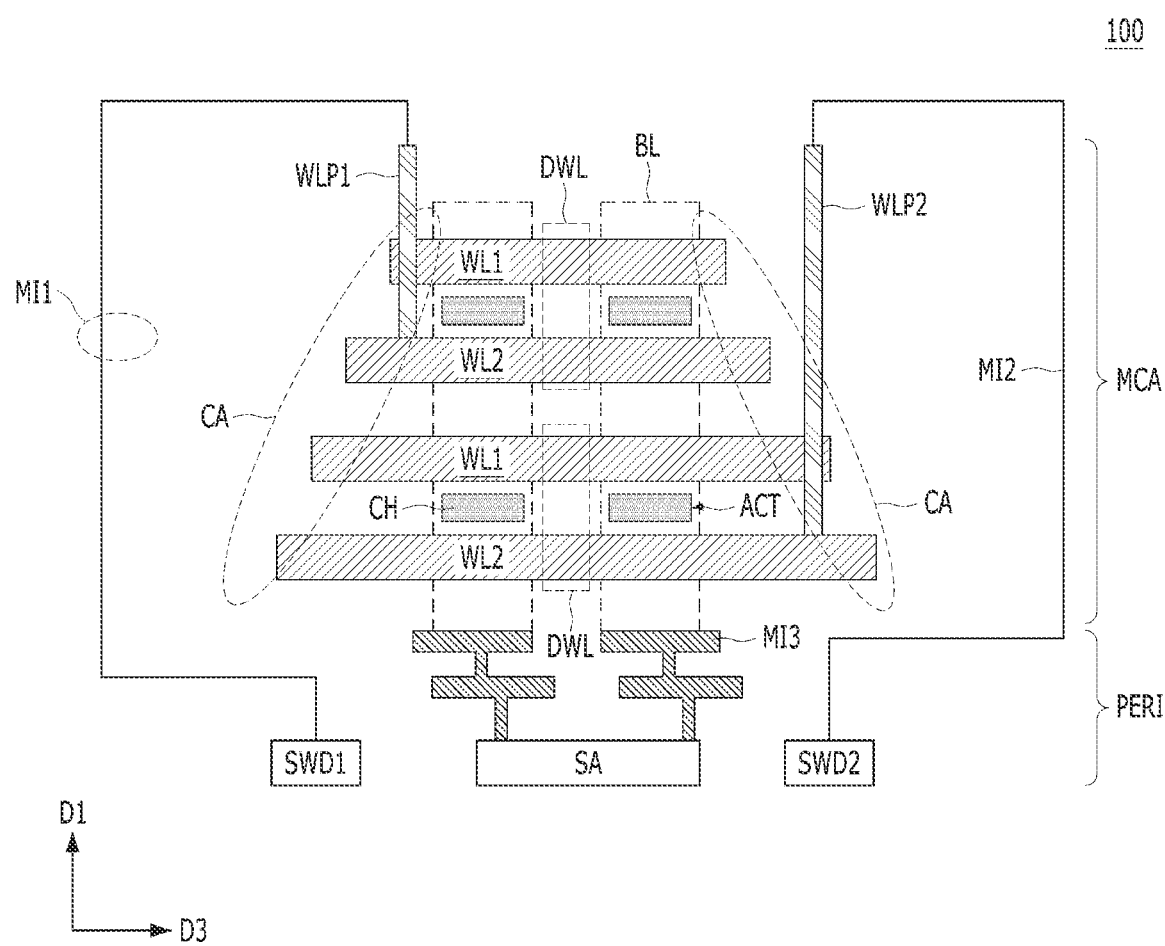
FIG. 5 is a cross-sectional view illustrating edge portions of double word lines.

FIG. 4A is a schematic perspective view illustrating a semiconductor memory device in accordance with an embodiment of the present invention. FIG. 4B is a cross-sectional view illustrating a vertical memory cell array MCA_C of FIG. 4A. FIG. 5 is a cross-sectional view illustrating edge portions of other double word lines.

Referring to FIGS. 4A, 4B, and 5, the semiconductor memory device 100 may include a multi-layered memory cell array MCA including memory cells MC according to FIG. 1 arranged in the first to third directions D1, D2, and D3. The memory cell array MCA may include a 3D array of memory cells MC. The 3D memory cell array MC may include a vertical memory cell array MCA_C and a lateral memory cell array MCA_R. The vertical memory cell array MCA_C may refer to an array of memory cells MC arranged vertically in the first direction D1. The lateral memory cell array MCA_R may refer to an array of memory cells MC arranged laterally in the third direction D3. The vertical memory cell array MCA_C may be referred to as a column array of memory cells MC. The lateral memory cell array MCA_R may be referred to as a row array of memory cells MC. The bit line BL may be vertically oriented to be coupled to the vertical memory cell array MCA_C, and the double word line DWL may be laterally oriented to be coupled to the lateral memory cell array MCA_R. The bit line BL coupled to the memory cells MC of the vertical memory cell array MCA_C may be referred to as a common bit line, and the vertical memory cell arrays MCA_C that are adjacent to each other in the third direction D3 may be coupled to different common bit lines. The double word line DWL coupled to the memory cells MC of the lateral memory cell array MCA_R may be referred to as a common double word line, and the lateral memory cell arrays MCA_R neighboring in the first direction D1 may be coupled to different common double word lines.

The memory cell array MCA may include a plurality of memory cells MC, and each of the memory cells MC may include a vertically oriented bit line BL, a laterally oriented active layer ACT, a double word line DWL, and a laterally oriented capacitor CAP. FIG. 4A illustrates a three-dimensional memory cell array including four memory cells MC.

Active layers ACT adjacent to each other in the first direction D1 may contact one bit line BL. The active layers ACT adjacent to each other in the third direction D3 may share one double word line DWL. Capacitors CAP may be coupled to corresponding one of the active layers ACT. The capacitors CAP may share one plate line PL. The individual active layer ACT may be thinner than the first word line WL1 and the second word line WL2 of the double word line DWL.

In the memory cell array MCA, two double word lines DWL may be vertically stacked in the first direction D1. Each double word line DWL may include a pair of a first word line WL1 and a second word line WL2. A plurality of active layers ACT may be laterally arranged to be spaced apart from each other in the second direction D2 between the first word line WL1 and the second word line WL2. The channel CH of the active layer ACT may be positioned between the first word line WL1 and the second word line WL2.

Each of the first word line WL1 and the second word line WL2 of the double word line DWL may include a low work function electrode LWG and a high work function electrode HWG. The low work function electrodes LWG may be adjacent to the capacitor CAP, and the high work function electrodes HWG may be adjacent to the bit line BL.

Referring back to FIG. 5, edge portions on both sides of each of the double word lines DWL may have step shapes, and the step shapes may define contact portions CA. Each of the first word lines WL1 and the second word lines WL2 may include edge portions on both sides, that is, the contact portions CA. Each of the contact portions CA may have a step shape.

A plurality of word line pads WLP1 and WLP2 may be coupled to the contact portions CA. The first word line pad WLP1 may be coupled to the contact portions CA of the first word line WL1 and the second word line WL2 at the upper level, and the second word line pad WLP2 may be coupled to the contact portions CA of the first word line WL1 and the second word lines WL2 at the lower level. The first word line WL1 and the second word line WL2 at the upper level may be interconnected to each other by the first word line pad WLP1. The first word line WL1 and the second word line WL2 at the lower level may be interconnected to each other by the second word line pad WLP2.

The semiconductor memory device 100 may further include a substrate PERI below the memory cell array MCA, and the substrate PERI may include a peripheral circuit portion. Hereinafter, the substrate PERI will be simply referred to as a peripheral circuit portion PERI. The bit lines BL of the memory cell array MCA may be oriented perpendicular to the surface of the peripheral circuit portion PERI, and the double word lines DWL may be oriented parallel to the surface of the peripheral circuit portion PERI.

The peripheral circuit portion PERI may be positioned at a lower level than the memory cell array MCA. This may be referred to as a COP (Cell over PERI) structure. The peripheral circuit portion PERI may include at least one or more control circuits for driving the memory cell array MCA. At least one or more control circuits of the peripheral circuit portion PERI may include an N-channel transistor, a P-channel transistor, a CMOS circuit, or a combination thereof. At least one or more control circuits of the peripheral circuit portion PERI may include an address decoder circuit, a read circuit, a write circuit, and the like. At least one or more control circuits of the peripheral circuit portion PERI may include a planar channel transistor, a recess channel transistor, a buried gate transistor, a fin channel transistor (FinFET) and the like.

For example, the peripheral circuit portion PERI may include sub-word line drivers SWD1 and SWD2 and a sense amplifier SA. The double word line DWL at the upper level may be coupled to the sub-word line driver SWD1 through the first word line pads WLP1 and the metal interconnections MI1. The double word line DWL at the lower level may be coupled to the sub-word line driver SWD2 through the second word line pads WLP2 and the metal interconnections MI2. The bit lines BL may be coupled to the sense amplifier SA through metal interconnections MI3. The metal interconnections MI3 may have a multi-level metal interconnection structure (MLM) including a plurality of vias and a plurality of metal lines.

Figure 6:
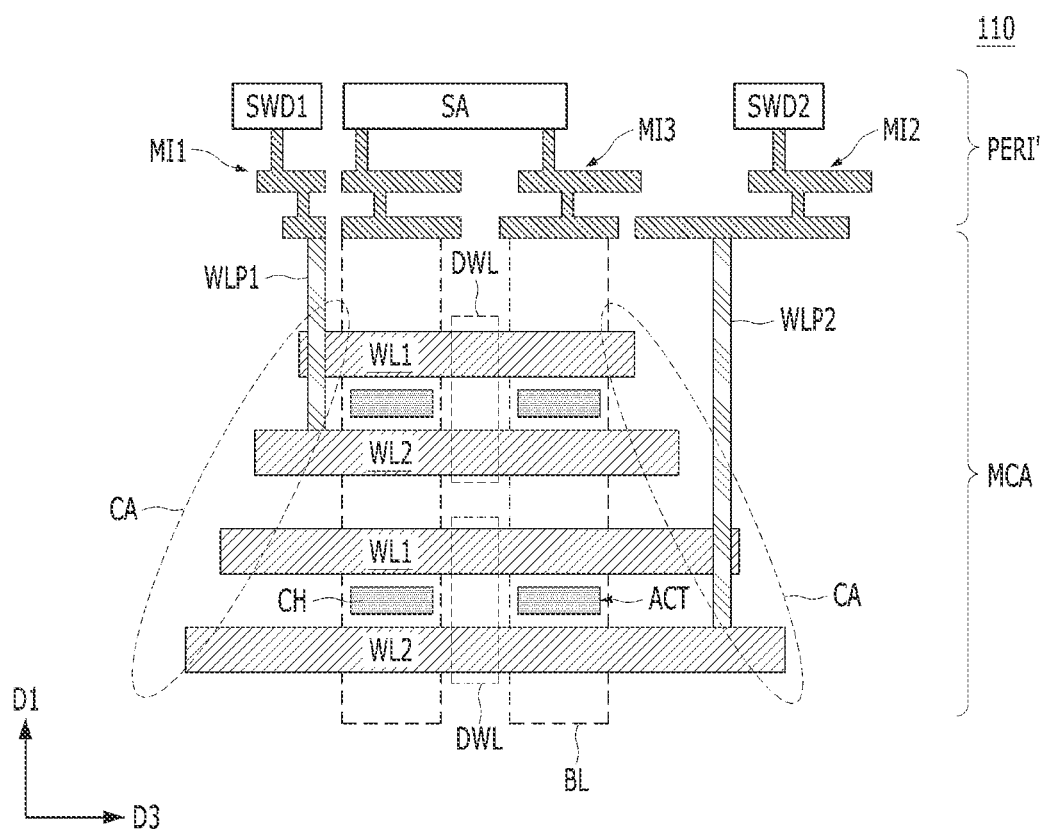
FIG. 6 is a cross-sectional view illustrating a semiconductor memory device in accordance with another embodiment of the present invention.

FIG. 6 is a schematic cross-sectional view illustrating a memory cell array of a semiconductor memory device in accordance with another embodiment of the present invention. FIG. 6 shows a semiconductor memory device 110 having a POC structure. In FIG. 6, detailed descriptions on the constituent elements also appearing in FIG. 5 may be omitted.

Referring to FIG. 6, the semiconductor memory device 110 may include a memory cell array MCA and a peripheral circuit portion PERI'. The peripheral circuit portion PERI' may be positioned at a higher level than the memory cell array MCA. This may be referred to as a POC (PERI over Cell) structure.

The peripheral circuit portion PERI' may include sub-word line drivers SWD1 and SWD2 and a sense amplifier SA. The double word line DWL at the upper level may be coupled to the sub-word line driver SWD1 through the first word line pads WLP1 and the metal interconnections MI1. The double word line DWL of the lower level may be coupled to the sub-word line driver SWD2 through the second word line pads WLP2 and the metal interconnections MI2. The bit lines BL may be coupled to the sense amplifier SA through metal interconnections MI3. The metal interconnections MI3 may have a multi-level metal interconnection structure including a plurality of vias and a plurality of metal lines.

Figure 7:
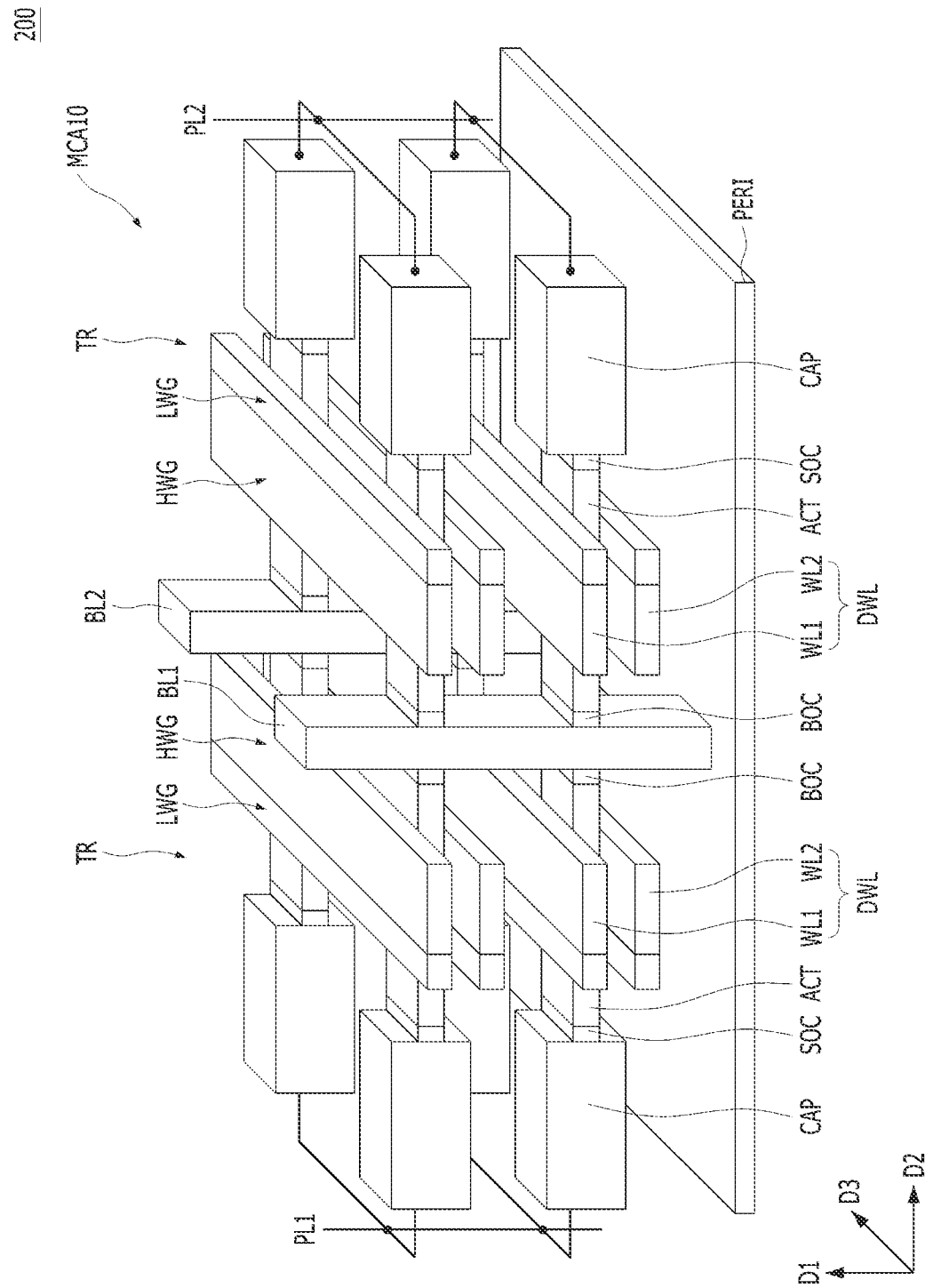
FIG. 7 is a schematic perspective view illustrating a semiconductor memory device in accordance with another embodiment of the present invention.

FIG. 7 is a schematic perspective view illustrating a semiconductor memory device in accordance with another embodiment of the present invention. In FIG. 7, detailed descriptions on the constituent elements also appearing in FIGS. 1 to 6 may be omitted.

Referring to FIG. 7, the semiconductor memory device 200 may include a peripheral circuit portion PERI and a memory cell array MCA10 over the peripheral circuit portion PERI. The memory cell array MCA10 may include a plurality of memory cells. As described above with reference to the memory cell array MCA of FIG. 3, the memory cell array MCA10 may include a column array of memory cells and a row array of memory cells. Each of the memory cells may include a transistor TR and a capacitor CAP, and each of the transistors TR may include an active layer ACT and a double word line DWL. The double word line DWL may include a low work function electrode LWG and a high work function electrode HWG that are laterally adjacent to each other in the second direction D2. Each of the capacitors CAP may be coupled to the active layer ACT through the storage node side-ohmic contact SOC. The bit lines BL1 and BL2 may be coupled to the active layers ACT through the corresponding bit line side-ohmic contacts BOC.

The column array of the memory cells may include a mirror-like structure that shares one of the bit lines BL1 and BL2.

For example, the column array including memory cells that are laterally arranged in the second direction D2 with the bit line BL1 interposed therebetween may be arranged in a mirror-like structure sharing the bit line BL1 while being coupled to different plate lines PL1 and PL2.

FIGS. 8A to 8F illustrate an example of a method for fabricating a double word line in accordance with embodiments of the present invention.

Figure 8A:
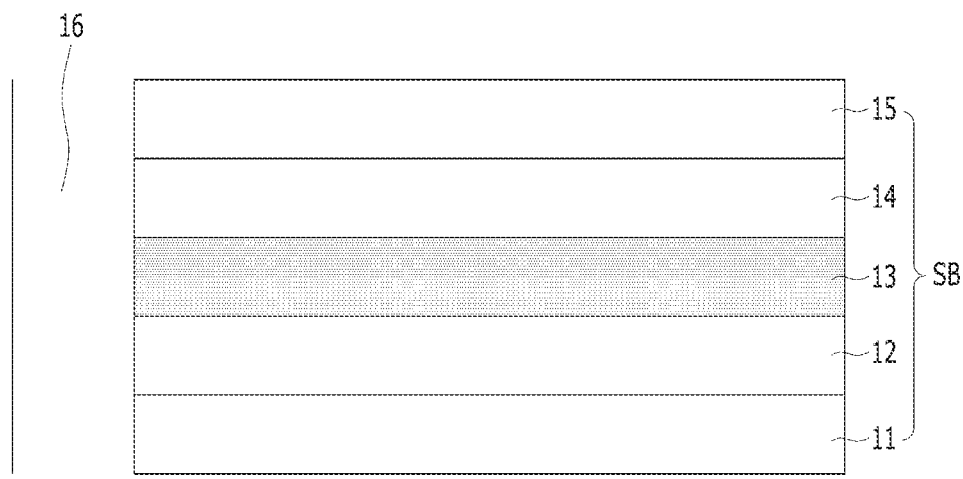
FIGS. 8A to 8F illustrate an example of a method for fabricating a double word line in accordance with embodiments of the present invention.

Referring to FIG. 8A, a stack body SB may be formed over a substrate (not shown). The stack body SB may include dielectric layers 11 and 15, sacrificial layers 12 and 14, and an active layer 13. The active layer 13 may be positioned between a lower dielectric layer 11 and an upper dielectric layer 15. A lower sacrificial layer 12 may be positioned between the lower dielectric layer 11 and the active layer 13, and an upper sacrificial layer 14 may be positioned between the upper dielectric layer 15 and the active layer 13. The dielectric layers 11 and 15 may include, for example, silicon oxide, and the sacrificial layers 12 and 14 may include silicon nitride. The active layer 13 may include a semiconductor material or an oxide semiconductor material. The active layer 13 may include polysilicon or IGZO. As described above, when the memory cells are stacked, the stack body SB may be stacked several times. According to another embodiment of the present invention, in order to form a thin-body active layer, which is thin, and a thin-body channel, which is thin, the active layer 13 may be formed thinner than the dielectric layers 11 and 15 and the sacrificial layers 12 and 14.

A first opening 16 may be formed by etching the stack body SB. The first opening 16 may extend vertically. Although not illustrated, before the first opening 16 is formed, the stack body SB may be patterned on the basis of a memory cell.

Figure 8B:
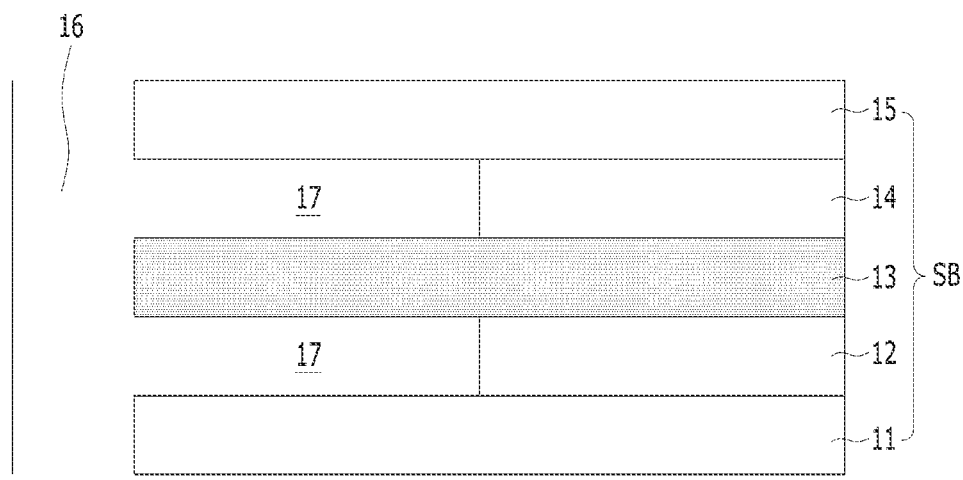

Referring to FIG. 8B, recesses 17 may be formed by selectively etching the sacrificial layers 12 and 14 through the first opening 16. A portion of the active layer 13 may be exposed by the recesses 17.

Figure 8C:
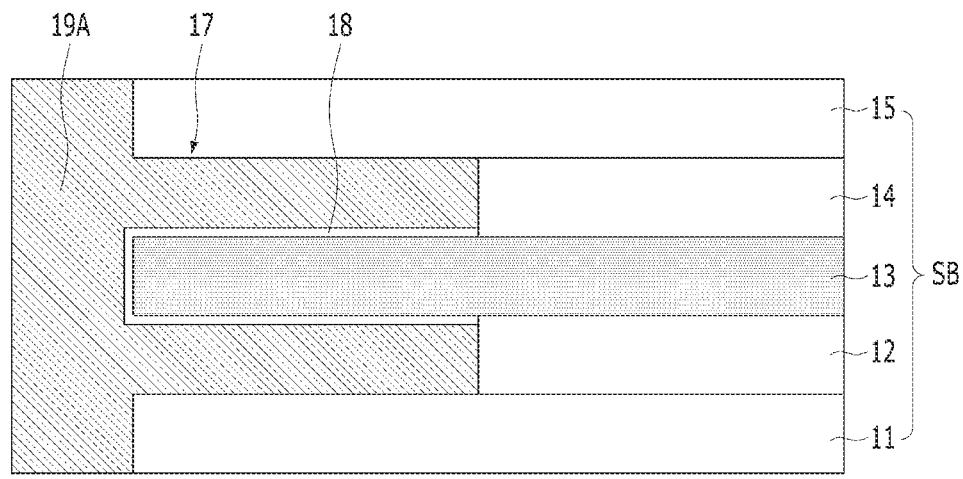

Referring to FIG. 8C, a gate dielectric layer 18 may be formed over the exposed portion of the active layer 13. The gate dielectric layer 18 may include, for example, silicon oxide, silicon nitride, a metal oxide, a metal oxynitride, a metal silicate, a high-k material, a ferroelectric material, an anti-ferroelectric material, or a combination thereof. The gate dielectric layer 18 may include $SiO_2$, $Si_3N_4$, $HfO_2$, $Al_2O_3$, $ZrO_2$, AlON, HfON, HfSiO, HfSiON, or the like.

Next, the recesses 17 may be filled with a low work function material 19A. The low work function material 19A may fill the first opening 16 and the recesses 17 over the gate dielectric layer 18. The low work function material 19A may include a conductive material. The low work function material 19A may have a work function which is lower than that of silicon. For example, the low work function material 19A may include polysilicon doped with an N-type impurity.

Figure 8D:
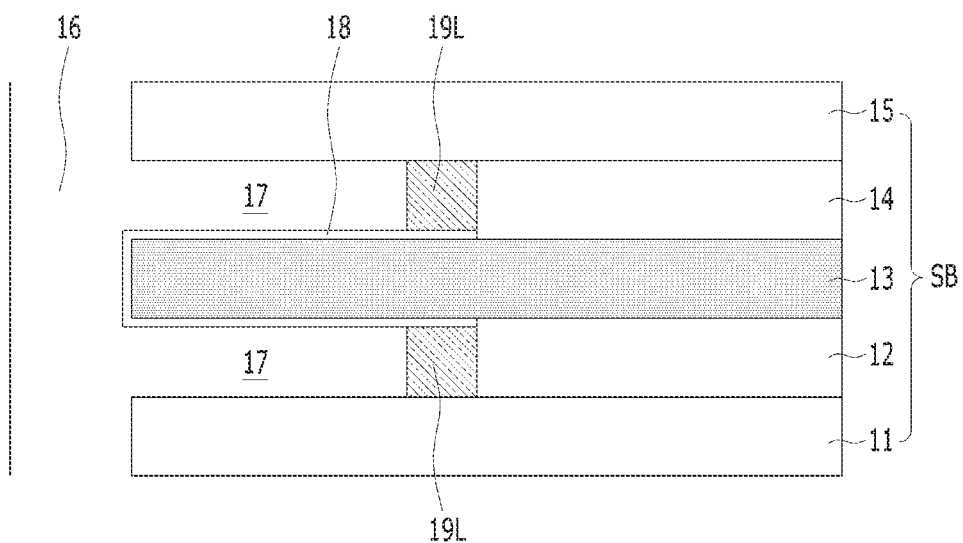

Referring to FIG. 8D, a low work function electrode 19L may be formed in the recesses 17. In order to form the low work function electrode 19L, the low work function material 19A may be selectively etched. For example, a wet etching process may be performed on the low work function material 19A.

Figure 8E:
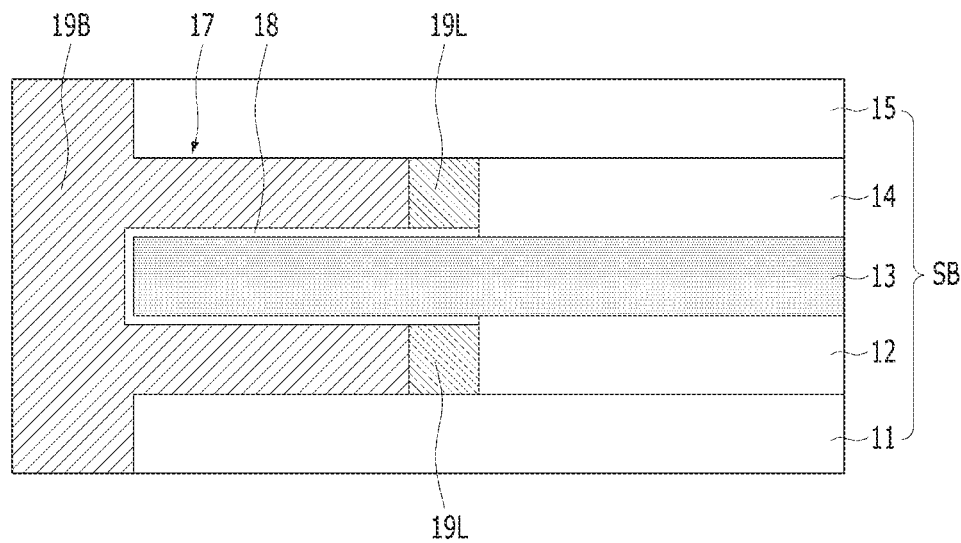

Referring to FIG. 8E, a high work function material 19B may be formed over the low work function electrode 19L to gap-fill the first opening 16 and the recesses 17. The high work function material 19B may have a higher work function than the mid-gap work function of silicon. The high work function material 19B may have a higher work function than the low work function electrode 19L. The high work function material 19B may have a lower resistance than the low work function electrode 19L. The high work function material 19B may include a metal-based material. For example, the high work function material 19B may include titanium nitride, tungsten, or a combination thereof. According to an embodiment of the present invention, the high work function material 19B may include a titanium nitride liner and tungsten that are sequentially stacked.

Figure 8F:
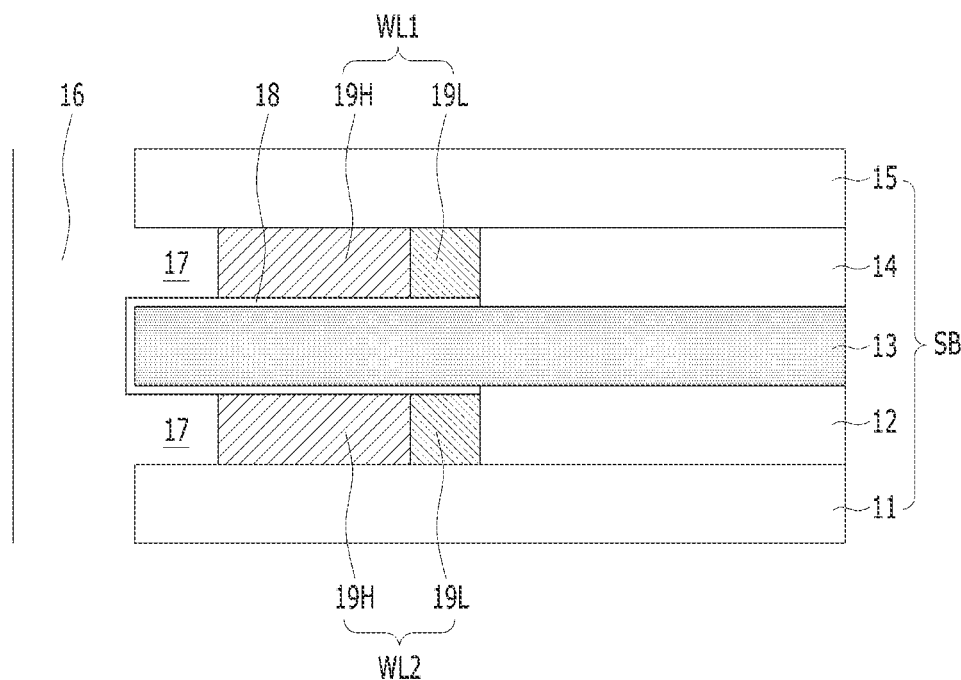

Referring to FIG. 8F, a high work function electrode 19H may be formed in the recesses 17. In order to form the high work function electrode 19H, selective etching of the high work function material 19B may be performed. For example, a wet etching process of the high work function material 19B may be performed.

The high work function electrode 19H may contact one side of the low work function electrode 19L. The high work function electrode 19H may have a higher work function than the low work function electrode 19L. The high work function electrode 19H may include a metal-based material. For example, the high work function electrode 19H may include titanium nitride, tungsten, or a combination thereof.

A first word line WL1 and a second word line WL2 may be formed with the active layer 13 interposed therebetween. The first and second word lines WL1 and WL2 may correspond to the double word lines DWL which are shown in FIGS. 1 to 7. Each of the first and second word lines WL1 and WL2 may have a dual work function electrode structure which includes the low work function electrode 19L and the high work function electrode 19H.

FIGS. 9A to 9G are cross-sectional views illustrating an example of a method for fabricating a bit line and a capacitor in accordance with embodiments of the present invention.

Figure 9A:
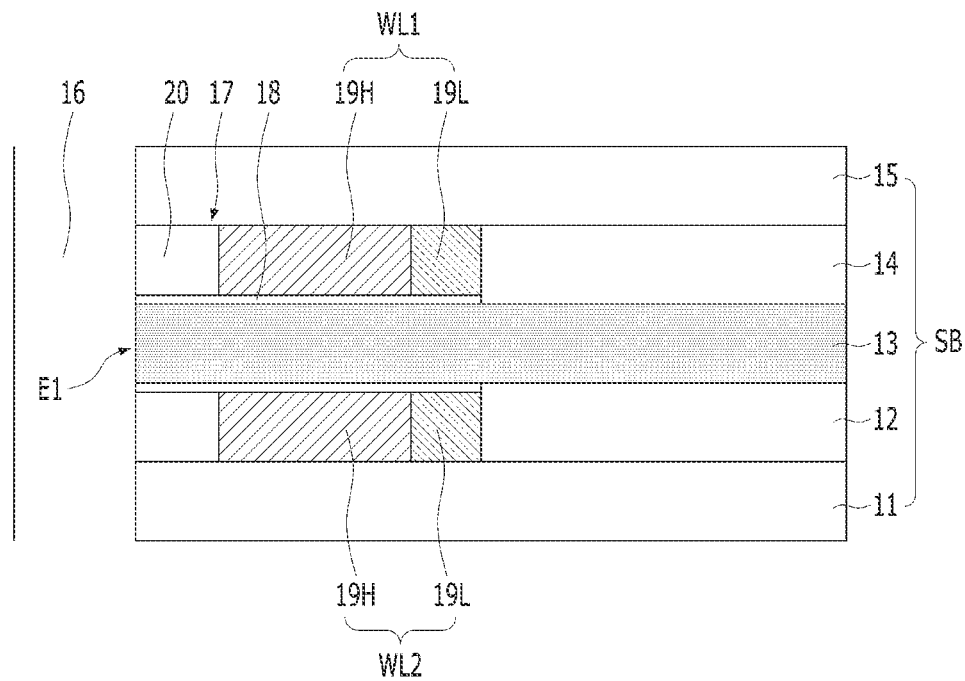
FIGS. 9A to 9G are cross-sectional views illustrating an example of a method for fabricating a bit line and a capacitor in accordance with embodiments of the present invention.

After the first and second word lines WL1 and WL2 are formed through a series of processes shown in FIGS. 8A to 8F, liner layers 20 may be formed on the side of the high work function electrode 19H as illustrated in FIG. 9A. The liner layers 20 may include, for example, silicon oxide or silicon nitride. The liner layers 20 may fill the other spaces of the recesses 17.

Subsequently, a portion of the gate dielectric layer 18 exposed by the liner layers 20 may be etched to expose a first end E1 of the active layer 13.

Figure 9B:
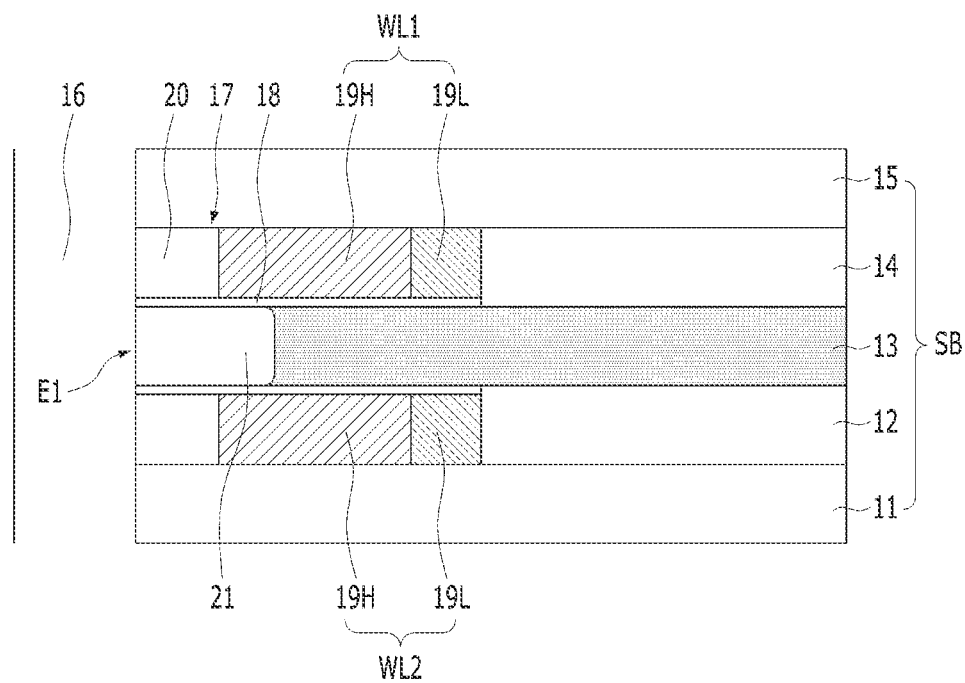

Referring to FIG. 9B, a first source/drain region 21 may be formed at the first end E1 of the active layer 13. The first source/drain regions 21 may be formed by an impurity doping process. According to another embodiment of the present invention, after the first opening 16 is filled with polysilicon containing an impurity, a heat treatment may be performed subsequently to diffuse the impurity from the polysilicon to the first end E1 of the active layer 13. As a result, the first source/drain region 21 may be formed at the first end E1 of the active layer 13.

Figure 9C:
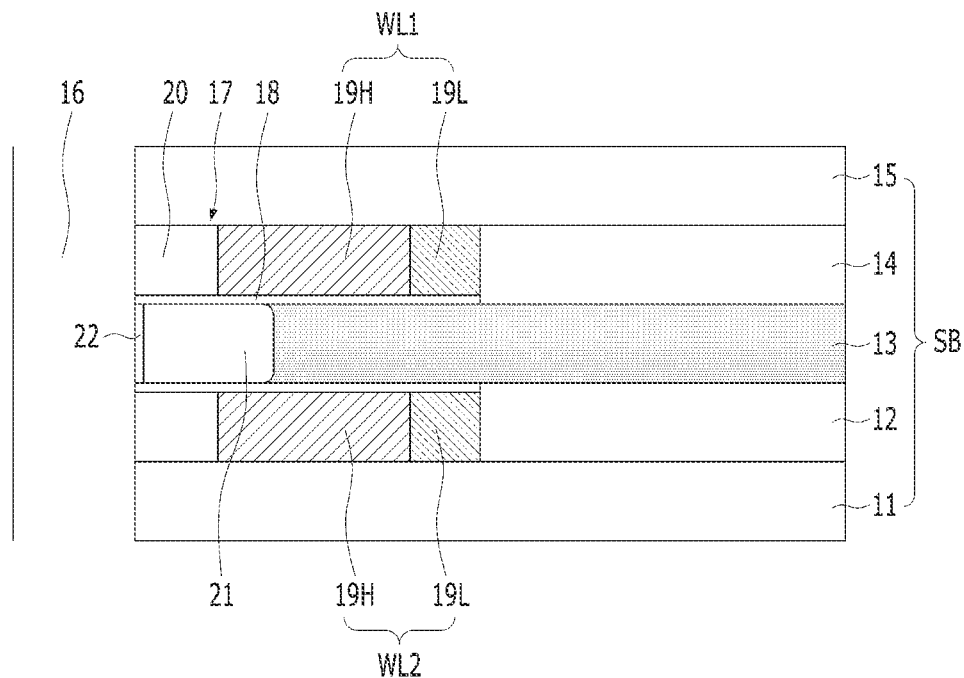

Referring to FIG. 9C, a bit line side-ohmic contact 22 may be formed over the first source/drain region 21. The bit line side-ohmic contact 22 may include a metal silicide. For example, a metal silicide may be formed by sequentially depositing a metal layer over the first source/drain region 21 and performing an annealing process, and the unreacted metal layer may be removed. The metal silicide may be formed as the silicon in the first source/drain region 21 reacts with the metal layer.

Figure 9D:
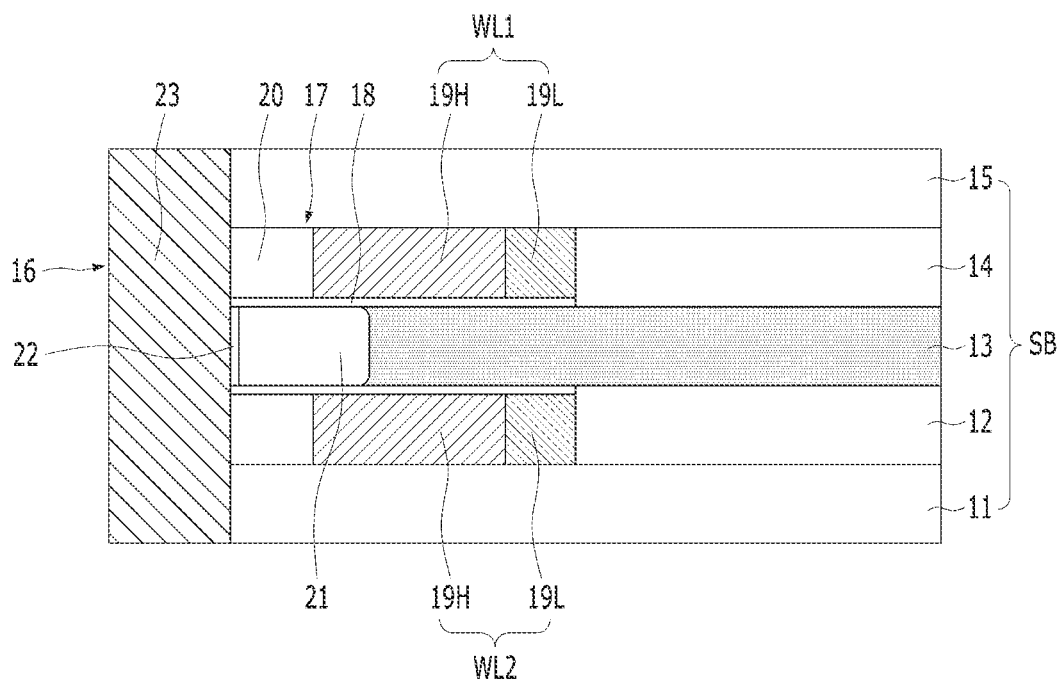

Referring to FIG. 9D, a bit line 23 contacting the bit line side-ohmic contact 22 may be formed. The bit line 23 may fill the first opening 16. The bit line 23 may include, for example, titanium nitride, tungsten, or a combination thereof.

Figure 9E:
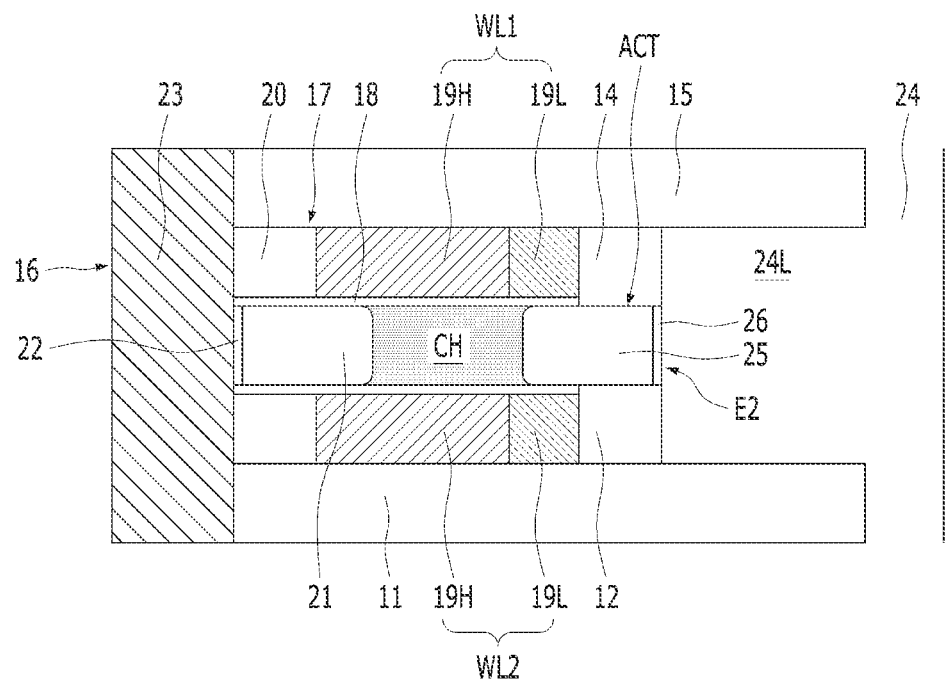

Referring to FIG. 9E, a second opening 24 may be formed by etching another portion of the stack body SB. The second opening 24 may extend vertically.

Subsequently, the sacrificial layers 12 and 14 and the active layer 13 may be selectively recessed through the second opening 24. As a result, a capacitor opening 24L may be formed between the dielectric layers 11 and 15. The active layer 13 may remain as indicated by a reference symbol 'ACT', and the second end E2 of the active layer ACT may be exposed by the capacitor opening 24L.

Subsequently, a second source/drain region 25 may be formed at the second end E2 of the recessed active layer ACT. The second source/drain regions 25 may be formed by an impurity doping process. According to another embodiment of the present invention, after the second opening 24 and the capacitor opening 24L are filled with polysilicon containing an impurity, a heat treatment may be performed subsequently to diffuse the impurity from the polysilicon to the second end E2 of the active layer ACT. As a result, the second source/drain regions 25 may be formed at the second end E2 of the active layer ACT. A channel CH may be defined between the first source/drain regions 21 and the second source/drain regions 25.

Subsequently, a storage node side-ohmic contact 26 may be formed over the second source/drain region 25. The storage node side-ohmic contact 26 may include, for example, a metal silicide. For example, the metal silicide may be formed by sequentially depositing a metal layer over the second source/drain region 25 and performing an annealing process, and the unreacted metal layers may be removed. The metal silicide may be formed as the silicon in the second source/drain region 25 reacts with a metal layer.

Figure 9F:
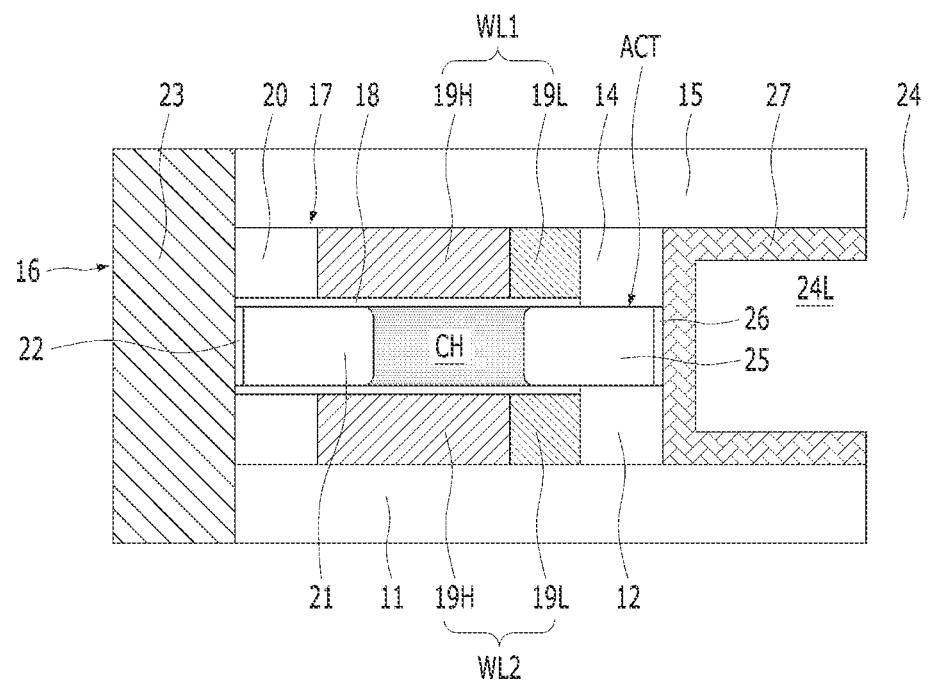

Referring to FIG. 9F, a storage node 27 may be formed to contact the storage node side-ohmic contact 26. The storage node 27 may be formed by depositing a conductive material and performing an etch-back process. The storage node 27 may include titanium nitride. The storage node 27 may have a laterally oriented cylindrical shape.

Figure 9G:
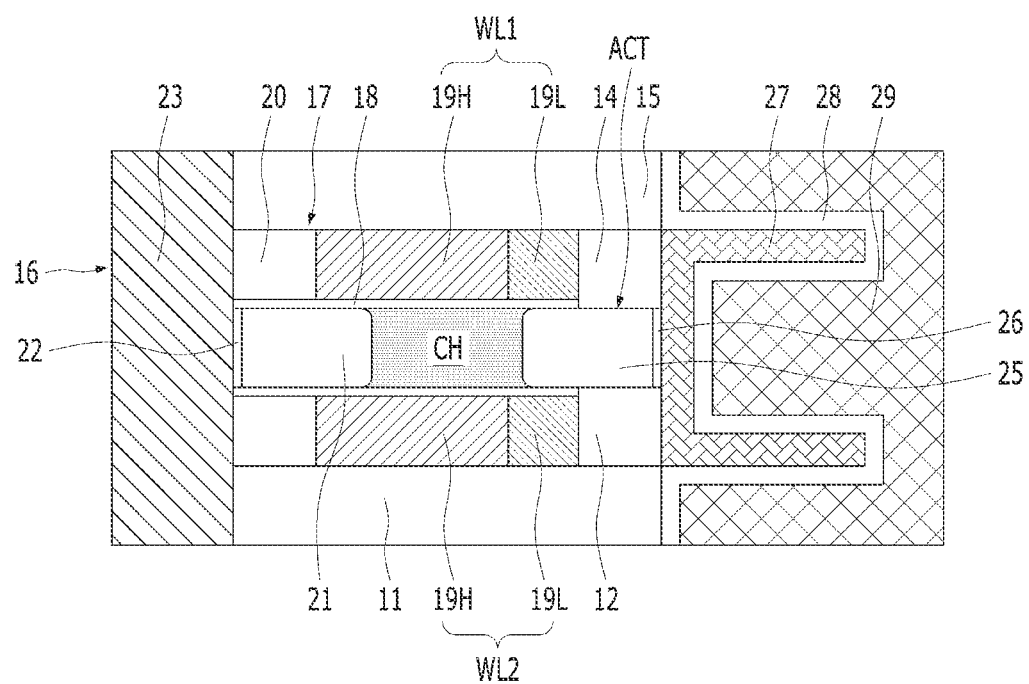

Referring to FIG. 9G, after the dielectric layers 11 and 15 are recessed, a dielectric layer 28 and a plate node 29 may be sequentially formed over the storage node 27.

Figure 10A:
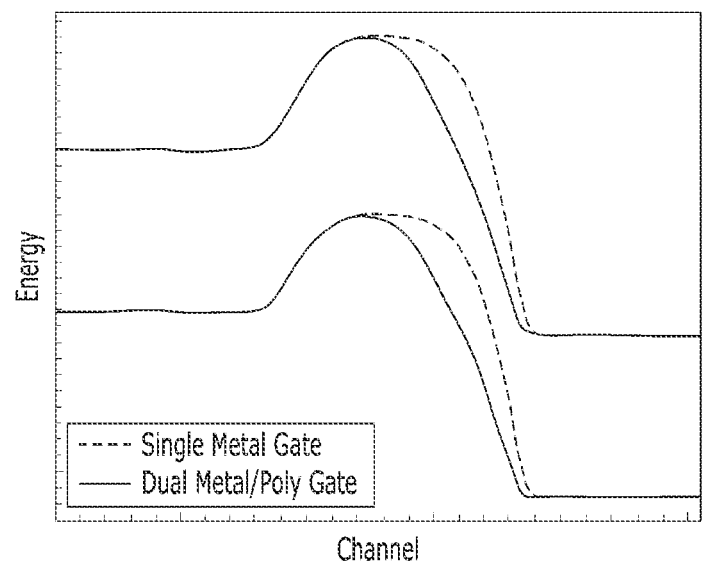
FIGS. 10A and 10B are graphs for comparing energy band diagrams and electric fields.
Figure 10B:
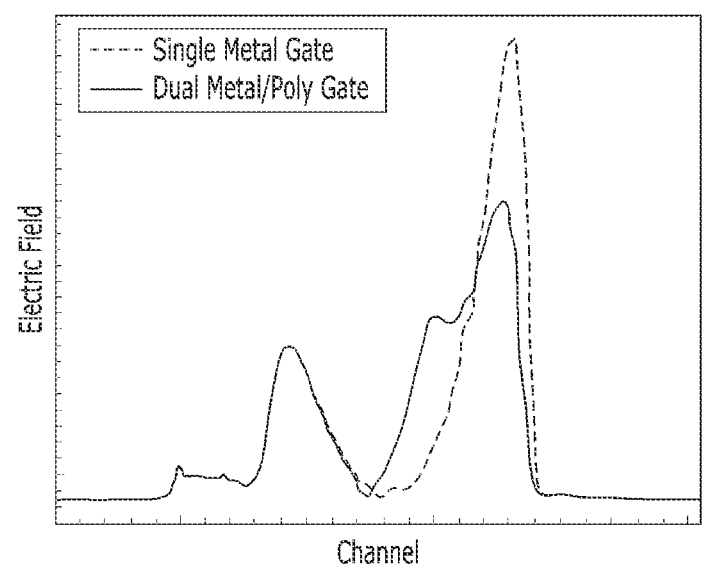

FIGS. 10A and 10B are graphs for comparing energy band diagrams and electric fields. FIGS. 10A and 10B compare energy band diagrams in a "1" hold state of a single metal gate structure and a dual metal/poly gate structure during a DRAM operation. Here, the "1" hold state is when the word line is at a low level and the bit line is at a low level, and the plate line is at a high level.

Referring to FIGS. 10A and 10B, it may be seen that a relatively low electric field is formed between the word line and the capacitor in the dual metal/poly gate structure while the potential barrier is maintained.

As described above, it may be seen that a 3D DRAM cell of the dual metal/poly gate structure achieves a sufficiently high threshold voltage and a low leakage current at the same time.

According to an embodiment of the present invention, since a word line has a dual work function electrode structure of a low work function electrode and a high work function electrode, it is possible to reduce power consumption while securing a refresh characteristic of a memory cell.

According to an embodiment of the present invention, as a double word line having a dual work function electrode structure is formed, it is possible to highly integrate memory cells including a thin-body channel.

While the present invention has been described with respect to specific embodiments, it will be apparent to those skilled in the art that various changes and modifications may be made without departing from the spirit and scope of the invention as defined in the following claims.

What is claimed is:

1. A semiconductor memory device comprising:
   an active layer spaced apart from a substrate wherein the active layer extends in a direction parallel to the substrate and includes a channel;
   a bit line extending in a direction perpendicular to the substrate and coupled to a first end of the active layer;
   a capacitor coupled to an end of a second end of the active layer;
   a double word line including a pair of dual work function electrodes extending in a direction crossing the active layer with the active layer interposed therebetween; and
   a gate dielectric layer formed between the active layer and the double word line,
   wherein each of the dual work function electrodes includes:
      a high work function electrode which is adjacent to the bit line; and
      a low work function electrode which is adjacent to the capacitor and having a lower work function than the high work function electrode,
   wherein the high work function electrode is in direct contact with the low work function electrode.

2. The semiconductor memory device of claim 1, wherein the low work function electrode has a lower work function than a mid-gap work function of silicon, and
   the high work function electrode has a higher work function than the mid-gap work function of silicon.

3. The semiconductor memory device of claim 1, wherein the low work function electrode includes an N-type doped polysilicon.

4. The semiconductor memory device of claim 1, wherein the high work function electrode includes a metal-based material.

5. The semiconductor memory device of claim 1, wherein the high work function electrode includes titanium nitride, tungsten, or a stack of titanium nitride and tungsten.

6. The semiconductor memory device of claim 1, wherein the high work function electrode has a larger volume than the low work function electrode.

7. The semiconductor memory device of claim 1, wherein each of the high work function electrode and the low work function electrode vertically overlaps with the active layer.

8. The semiconductor memory device of claim 7, wherein an overlapping area between the high work function electrode and the active layer is larger than an overlapping area between the low work function electrode and the active layer.

9. The semiconductor memory device of claim 1, wherein the channel of the active layer includes
   a thin-body channel which is thinner than the high work function electrode and the low work function electrode.

10. The semiconductor memory device of claim 1, wherein the active layer includes a semiconductor material or an oxide semiconductor material.

11. The semiconductor memory device of claim 1, wherein the active layer includes polysilicon, germanium, silicon-germanium, or IGZO (Indium Gallium Zinc Oxide).

12. The semiconductor memory device of claim 1, wherein the active layer further includes
   a first source/drain region coupled to the bit line, and
   a second source/drain region coupled to the capacitor.

13. The semiconductor memory device of claim 12, further comprising:
   a bit line side-ohmic contact between the bit line and the first source/drain region, and
   a storage node side-ohmic contact between the capacitor and the second source/drain region.

14. The semiconductor memory device of claim 1, further comprising:
   a word line pad coupled to the double word line.

15. The semiconductor memory device of claim 1, wherein the capacitor includes
   a cylindrical storage node coupled to the end of the other side of the active layer.

16. A semiconductor memory device, comprising:
   a substrate;
   active layers stacked in a direction perpendicular to a surface of the substrate and including channels;
   a bit line coupled to first ends of the active layers and oriented in a direction perpendicular to the surface of the substrate;
   capacitors coupled to second ends of the active layers and including storage nodes that are stacked in the direction perpendicular to the surface of the substrate;
   double word lines having a first word line and a second word line that are oriented in a direction parallel to the surface of the substrate with each of the active layers interposed therebetween; and
   gate dielectric layers formed between the active layers and the double word lines, respectively,
   wherein each of the first word line and the second word line includes:
      a high work function electrode which is adjacent to the bit line; and
      a low work function electrode which is adjacent to the storage nodes and having a lower work function than the high work function electrode,
   wherein the high work function electrode is in direct contact with the low work function electrode.

17. The semiconductor memory device of claim 16, wherein the low work function electrode has a lower work function than a mid-gap work function of silicon, and
   the high work function electrode has a higher work function than the mid-gap work function of silicon.

18. The semiconductor memory device of claim 16, wherein the low work function electrode includes N-type doped polysilicon, and
   the high work function electrode includes a metal-based material.

19. The semiconductor memory device of claim 16, wherein the high work function electrode includes titanium nitride, tungsten, or a stack of titanium nitride and tungsten.

20. The semiconductor memory device of claim 16, wherein the channels of the active layers include
   a thin-body channel which is thinner than the high work function electrode and the low work function electrode.

21. The semiconductor memory device of claim 16, wherein the active layers include
   a semiconductor material or an oxide semiconductor material.

22. The semiconductor memory device of claim 16, wherein the active layers include polysilicon, germanium, silicon-germanium, or IGZO (Indium Gallium Zinc Oxide).

23. The semiconductor memory device of claim 16, wherein the active layer further includes
   a first source/drain region coupled to the bit line, and
   a second source/drain region coupled to the capacitor.

24. The semiconductor memory device of claim 23, further comprising:

a bit line side-ohmic contact between the bit line and the first source/drain region, and a storage node side-ohmic contact between the capacitor and the second source/drain region.

25. The semiconductor memory device of claim 16, further comprising:

a word line pad coupled in common to the first word line and the second word line.

26. The semiconductor memory device of claim 16, wherein each of the capacitors includes a cylindrical storage node coupled to the ends of the other side of the active layers, a dielectric layer over the storage node, and a plate node over the dielectric layer.

27. The semiconductor memory device of claim 16, wherein the substrate includes a peripheral circuit portion suitable for controlling the memory cells.

* * * * *